(12) United States Patent
Miyajima et al.

(10) Patent No.: US 7,407,608 B2
(45) Date of Patent: Aug. 5, 2008

(54) RESIN MOLDING EQUIPMENT AND RESIN MOLDING METHOD

(75) Inventors: Fumio Miyajima, Chikuma (JP); Kazuhiko Kobayashi, Chikuma (JP); Kenji Nakajima, Chikuma (JP); Naoya Gotoh, Chikuma (JP); Kazuhiko Kobayashi, Chikuma (JP); Kazuro Wada, Chikuma (JP); Haruhisa Makino, Chikuma (JP); Haruhisa Takahashi, Chikuma (JP)

(73) Assignee: APIC Yamada Corporation, Nagano (JP)

( * ) Notice: Subject to any disclaimer, the term of this patent is extended or adjusted under 35 U.S.C. 154(b) by 318 days.

(21) Appl. No.: 11/262,851

(22) Filed: Nov. 1, 2005

(65) Prior Publication Data

US 2006/0093692 A1 May 4, 2006

(30) Foreign Application Priority Data

| Nov. 2, 2004 | (JP) | ................................ 2004-319020 |
| May 10, 2005 | (JP) | ................................ 2005-136933 |
| Jun. 10, 2005 | (JP) | ................................ 2005-171183 |
| Jun. 27, 2005 | (JP) | ................................ 2005-186102 |
| Jul. 12, 2005 | (JP) | ................................ 2005-202440 |
| Sep. 21, 2005 | (JP) | ................................ 2005-273275 |

(51) Int. Cl.
*B29C 45/14* (2006.01)
*H01L 21/56* (2006.01)

(52) U.S. Cl. ............ 264/40.1; 264/272.15; 264/272.17; 425/89; 425/126.1; 425/141; 425/182; 425/449

(58) Field of Classification Search ................ 425/89, 425/116, 126.1, 141, 182, 449; 264/272.15, 264/272.17, 40.1

See application file for complete search history.

(56) References Cited

U.S. PATENT DOCUMENTS

| 4,257,840 | A | * | 3/1981 | Fujii ............................ 156/556 |
| 4,973,239 | A | * | 11/1990 | Herrmann et al. ............ 425/135 |
| 5,200,202 | A | * | 4/1993 | Ahn ......................... 425/126.1 |
| 6,224,936 | B1 | * | 5/2001 | Gochnour et al. ........... 427/96.2 |
| 6,988,879 | B2 | * | 1/2006 | Ho et al. .................. 425/126.1 |
| 7,175,405 | B2 | * | 2/2007 | Kobayashi et al. ............ 425/116 |
| 2002/0015748 | A1 | * | 2/2002 | Miyajima et al. ............... 425/89 |

FOREIGN PATENT DOCUMENTS

| JP | 01235616 A | * | 9/1989 |
| JP | 11330114 A | * | 11/1999 |
| JP | 2000277551 A | * | 10/2000 |
| JP | 2003-165133 A | | 6/2003 |
| JP | 2005183787 A | * | 7/2005 |

OTHER PUBLICATIONS

Partial machine translation of JP 2003-165133 A obtained from the JPO website. The date of the reference is Jun. 10, 2003.*

* cited by examiner

*Primary Examiner*—Robert B Davis
(74) *Attorney, Agent, or Firm*—Birch, Stewart, Kolasch & Birch, LLP

(57) ABSTRACT

The resin molding equipment comprises: a work piece feeding section; a work piece measuring section measuring thickness of a semiconductor chip mounted on a work piece; a resin supplying section supplying liquid resin to the work piece; a resin molding section having a molding die for molding the work piece with the liquid resin; a product measuring section measuring thickness of a resin molded part of the molded product; a product accommodating section; and a control section for controlling the sections. The control section includes means for adjusting an amount of the liquid resin, which is supplied to the work piece by the resin supplying section, on the basis of the thickness measured by the work piece measuring section.

16 Claims, 12 Drawing Sheets

RESIN MOLDING EQUIPMENT AND RESIN MOLDING METHOD

BACKGROUND OF THE INVENTION

The present invention relates to a resin molding equipment and a resin molding method, more precisely relates to a resin molding equipment and a resin molding method, which are capable of precisely controlling amount of supplying resin and precisely molding a work piece with the resin.

A compression molding method has been known. In the method, liquid resin, powder resin or resin paste is supplied onto a work piece, which has been set in a molding die, and the work piece is clamped together with the resin and molded in the die. The applicant of the present invention invented resin compression-molding equipment, which measures weight of work pieces and thicknesses of semiconductor chips, calculates an amount of supplying resin and adjusts the amount of supplying the resin on the basis of variations of the work pieces (Japanese Patent Gazette No. 2003-165133).

In the compression molding method, variations of supplying the resin to the work pieces directly influence to qualities of products, so it is necessary to measure thicknesses of the semiconductor chips, etc. and adjust the amount of supplying the resin to each semiconductor chip.

However, even if the amount of supplying resin is calculated, the work pieces cannot be sufficiently molded with resin. We think that thicknesses of work pieces including semiconductor chips vary so that suitable molding conditions must be changed, and the amount of supplying resin varies due to accuracy of a resin supplying unit.

These days, thickness of a resin molded part of a product is 1 mm or less, so variations of resin molding conditions highly influence to qualities of molded products.

SUMMARY OF THE INVENTION

The present invention was conceived to improve qualities of molded products, which are influenced by slight variations of resin molding conditions.

An object of the present invention is to provide a resin molding equipment and a resin molding method, which are capable of producing molded products having uniform qualities even if molding conditions are varied by configurations of work pieces, amounts of supplying resin, etc.

To achieve the object, the present invention has following structures.

The resin molding equipment of the present invention comprises:
a work piece feeding section;
a work piece measuring section measuring thickness of a semiconductor chip mounted on a work piece;
a resin supplying section supplying liquid resin to the work piece;
a resin molding section having a molding die for molding the work piece with the liquid resin;
a product measuring section measuring thickness of a resin molded part of the molded product;
a product accommodating section; and
a control section for controlling the sections,
wherein the control section includes means for adjusting an amount of the liquid resin, which is supplied to the work piece by the resin supplying section, on the basis of the thickness measured by the work piece measuring section.

Note that, in the present invention, the liquid resin means liquid-type resin and paste-type resin, which will be supplied by a dispenser.

In the resin molding equipment, the value measured by the work piece measuring section is used for adjusting the amount of the liquid resin supplied to the work piece, so that the work piece can be sufficiently molded with the resin.

In the resin molding equipment, the control section may include means for adjusting an amount of the liquid resin, which is supplied to the work piece by the resin supplying section, on the basis of the thickness measured by the product measuring section. With this structure, the work piece can be further sufficiently molded with the resin.

In the resin molding equipment, the molding die may include a press mechanism, which flatly presses the work piece onto a clamping face of the molding die at a prescribed position therein. With this structure, the work piece can be securely held in the molding die while molding, and a cycle time of the resin molding can be shortened.

In the resin molding equipment, the resin supplying section may include a dispenser, which supplies a prescribed amount of the liquid resin to the work piece, and
the dispenser comprises:
a cylinder block including a cylinder part storing the liquid resin, a fluid path connecting the cylinder part to a liquid container and a fluid path connecting the cylinder part to a discharge nozzle;
a plunger sliding in the cylinder part;
a supply valve being provided to the cylinder block, the supply valve opening and closing the fluid path between the cylinder block and the liquid container;
a discharge valve being provided to the cylinder block, the discharge valve opening and closing the fluid path between the cylinder block and the discharge nozzle; and
driving units respectively driving the plunger, the supply valve and the discharge valve. With this structure, the prescribed amount of the liquid resin can be correctly supplied to the work piece.

Preferably, base ends of the plunger, the supply valve and the discharge valve are respectively connected to connecting ends of the driving units, and
the connected parts are not disconnected in moving directions of the plunger, the supply valve and the discharge valve, but they can be disconnected in directions perpendicular to the moving directions thereof. With this structure, the dispenser can be easily attached to and detached from the resin supplying section, and maintenance of the resin molding equipment can be easily performed.

In the resin molding equipment, the molding die may comprise:
a cavity block being formed on the basis of an arrangement of a cavity, in which the work piece is molded with the resin;
a clamper enclosing the cavity block so as to form a cavity concave, whose inner bottom face is constituted by an end face of the cavity block, the clamper being capable of sliding on a side face of the cavity block in directions of opening and closing the molding die; and
an air sucking hole being formed in an inner face of the clamper, which slidably contacts the side face of the cavity block, the air sucking hole being communicated to the cavity concave so as to suck a release film into the cavity concave, the air sucking hole being closed when the cavity block is moved to a position for clamping the die. With this structure, the work piece can be suitably molded without forming projections in an outer surface of a resin molded part.

In the resin molding equipment, the molding die may have:
a cavity for molding an element mounting area of an electronic device with the resin; and a dummy cavity being communicated to an edge of the cavity so as to trap air. With this structure, no voids are formed in the resin molded part of the molded product.

In the resin molding equipment, a resin molding area of the molding die, which clamps and molds the work piece, may be enclosed by a vacuum chamber, and air in the vacuum chamber may be discharged by a vacuum unit. With this structure, forming voids in the resin molded part can be further prevented.

The resin molding method of the present invention is performed in the resin molding equipment of the present invention. A work piece including a plurality of semiconductor chips layered on a substrate is compression-molded in the molding die with resin. The method comprises the steps of:

storing cubic volumes of the semiconductor chips and amount of supplying the resin to each semiconductor chip;

measuring a distance "Z" between the substrate and the outermost semiconductor chip;

detecting a number of layering the semiconductor chips on the basis of the measured distance "Z";

calculating amount of supplementing the resin to the semiconductor chips;

sending the amount of supplementing the resin to the resin supplying section as control data; and supplying the resin to the work piece from the resin supplying section on the basis of the control data. With this method, bad work pieces can be detected, so that producing defected products can be prevented and production yield of producing expensive devices can be improved.

BRIEF DESCRIPTION OF THE DRAWINGS

Embodiments of the present invention will now be described by way of examples and with reference to the accompanying drawings, in which.

DETAILED DESCRIPTION OF THE EMBODIMENTS

Preferred embodiments of the present invention will now be described in detail with reference to the accompanying drawings.

Entire Structure of the Resin Molding Equipment

Figure 1:
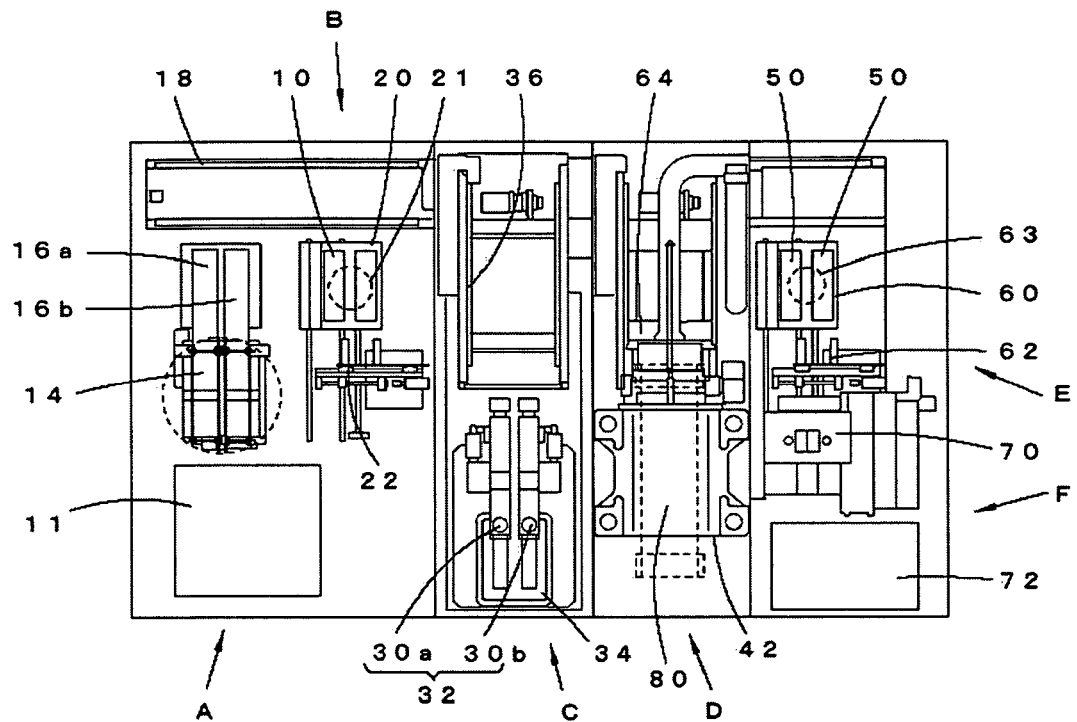
FIG. 1 is a plan view of an embodiment of the resin molding equipment of the present invention.
Figure 2:
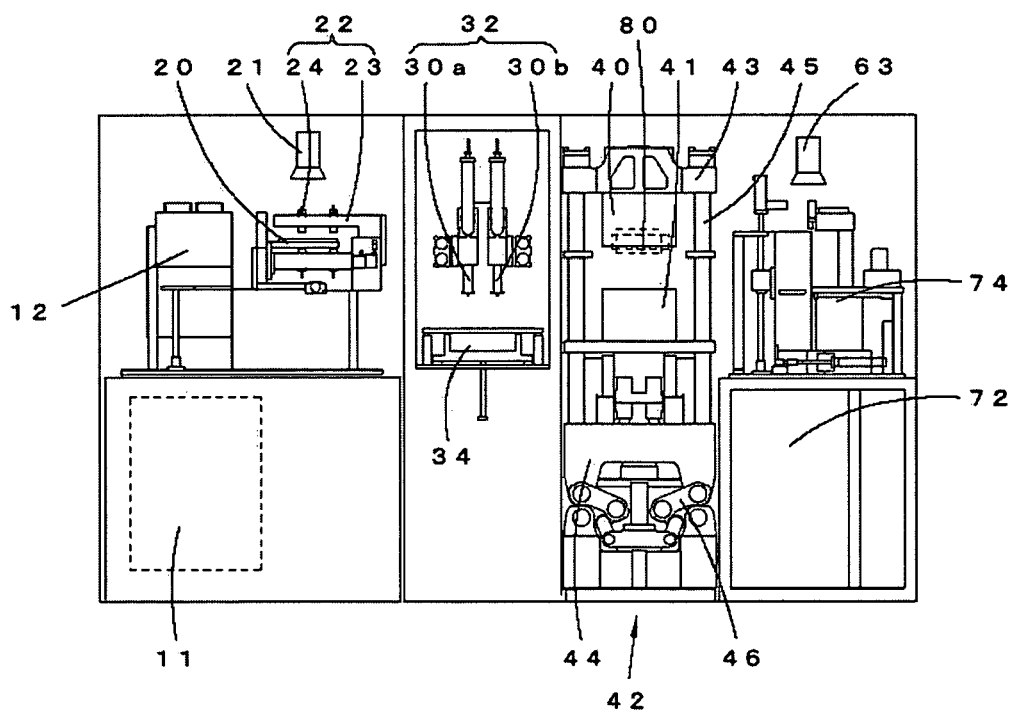
FIG. 2 is a front view of the resin molding equipment.

FIGS. 1 and 2 are a plan view and a front view showing an entire structure of an embodiment of the resin molding equipment of the present invention. Structures of each section will be explained.

As shown in FIG. 1, the resin molding equipment comprises: a work piece feeding section (A); a work piece measuring section (B) measuring thickness of a semiconductor chip mounted on a work piece; a resin supplying section (C) supplying liquid resin to the work piece; a resin molding section (D) having a molding die for molding the work piece with the liquid resin; a product measuring section (E) measuring thickness of a resin molded part of the molded product; and a product accommodating section (F).

Figure 3:
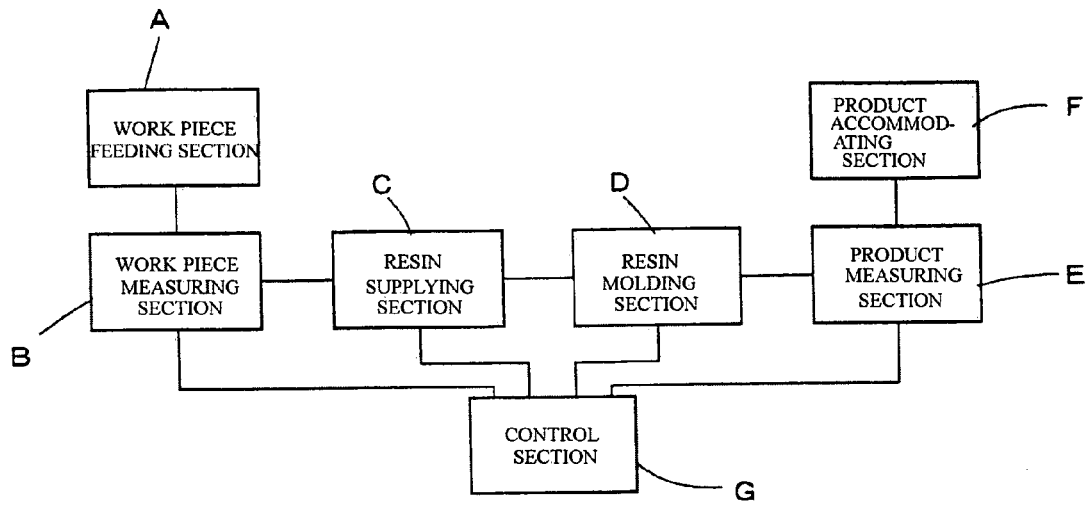
FIG. 3 is a block diagram of the resin molding equipment.

FIG. 3 is a block diagram of the resin molding equipment of the present embodiment. A control section (G) controls the above described sections (A-F) so as to feed the work piece, supply the resin to the work piece, mold the work piece with the resin and accommodate the molded product.

Note that, the work piece 10 of the present embodiment is constituted by a substrate and two lines of semiconductor chips mounted thereon.

The work piece feeding section (A) has: a setting unit 11 including a plurality of magazines, in each of which the work pieces 10 are accommodated; a take-out mechanism including an elevator, which vertically moves the magazines of the setting section (A), and a pusher for feeding the work pieces 10 from the magazine; and a setting mechanism including a turn table 14 for heading two work pieces 10, which have been taken out parallel from the magazine, to correspond to setting positions in the resin molding section (D), etc.

A setting station, on which the work pieces 10, which have been arranged parallel by the turn table 14, are temporally held, is provided on the rear side of the turn table 14. A pair of feeder rails 16a and 16b, which are used for conveying the work pieces 10, are provided between the turn table 14 and the setting station.

The work piece measuring section (B) has: an X-Y table 20 for holding the work pieces 10; and a sensor unit 22 for measuring thicknesses of the work pieces 10, which have been held by the X-Y table 20. The X-Y table 20 holds two work pieces 10 arranged parallel. A camera 21 for processing picture images is provided above the X-Y table 20.

An inloader 36 conveys the work pieces 10 from the setting station to the X-Y table 20 on a rail 18, which is provided between the setting station and a side position of the X-Y table 20.

As shown in FIG. 2, the sensor unit 22 of the measuring section (B) is constituted by a U-shaped frame 23 and sensors 24a and 24b attached to the frame 23.

Figure 4:
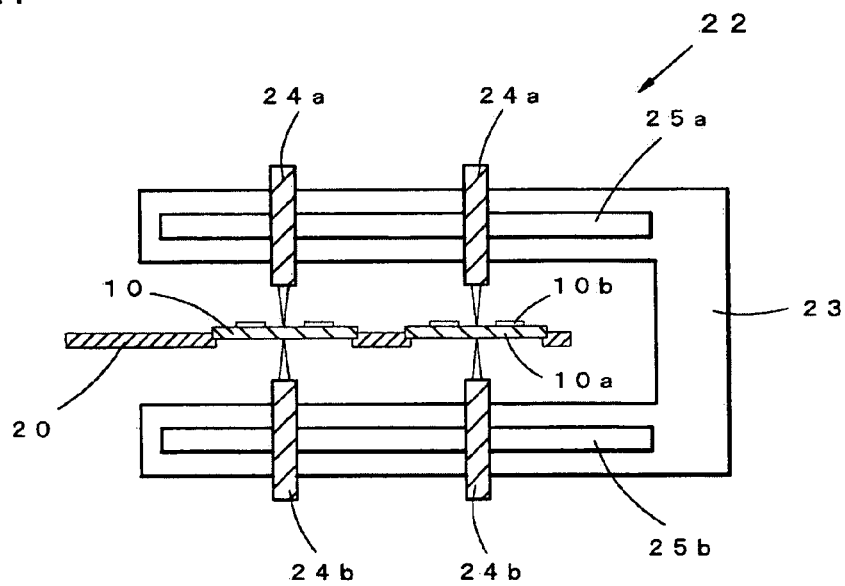
FIG. 4 is a front view of a sensor unit.
Figure 5:
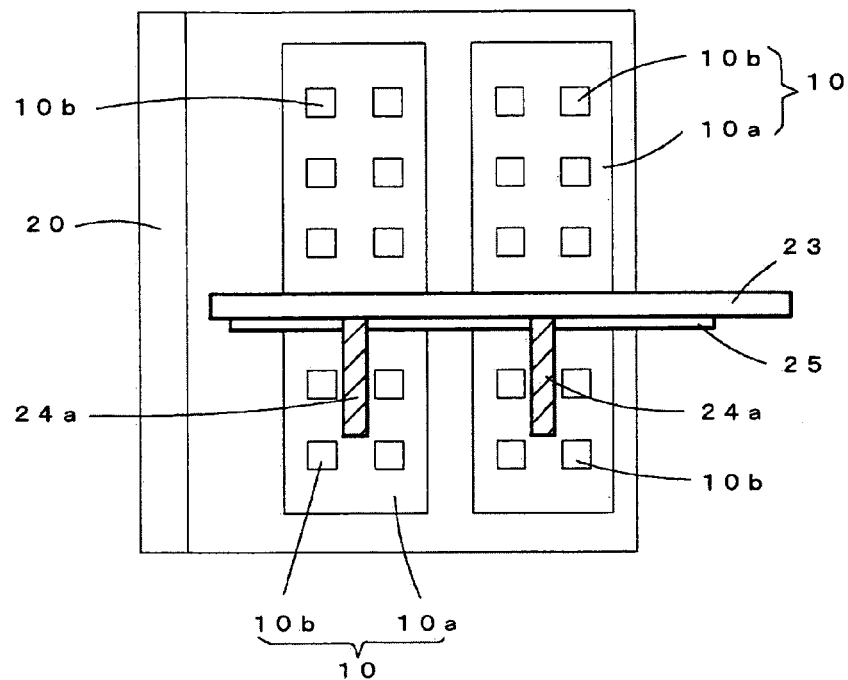
FIG. 5 is a plan view of the sensor unit.

FIGS. 4 and 5 are enlarged views of the sensor unit 22. In the present embodiment, the sensors 24a and 24b of the sensor unit 22 irradiate laser beams toward the work pieces 10 and receive reflected beams, which have been reflected from the work pieces 10, so as to measure thicknesses of the work pieces 10. In FIG. 4, each pair of sensors 24a and 24b are separately arranged in the vertical direction, and they respectively measure distances to the substrate of the work piece 10, then the measured distances are subtracted from a distance between the sensors 24a and 24b so as to calculate thickness of the substrate.

Since two work pieces 10 are held parallel on the X-Y table 20 with a prescribed separation, two pairs of the sensors 24a and 24b are arranged with a separation so as to correspond to the arrangements of the work pieces 10. The sensors 24a and 24b are slidably attached to guides 25a and 25b, so sensing positions of the sensors 24a and 24b can be adjusted. The sensing positions of the sensors 24a and 24b are determined on the basis of the separation between the work pieces 10 held on the X-Y table 20.

The resin supplying section (C) includes: a dispensing unit 32, which is constituted by dispensers 30a and 30b for supplying liquid resin to the semiconductor chips 10b on the substrates 10a; and an X-Y table 34 for holding the work pieces 10.

In the present embodiment, as shown in FIG. 1, the resin supplying section (C) is provided in a center front part of a base. A pair of the dispensers 30a and 30b is employed so as to respectively supply liquid resin to two of the work pieces 10 held on the X-Y table 34. The X-Y table 34 is controlled to move in a horizontal plane (in an X-direction and a Y-direction perpendicular to the X-direction) and move in the vertical direction (in a Z-direction perpendicular to the X- and Y-directions).

The inloader 36 is provided on the rear side of the resin supplying section (C) so as to convey the work pieces 10 from the measuring section (B) to the resin supplying section (C) and further conveys the work pieces 10 from the resin supplying section (C) to the resin molding section (D). The inloader 26 has a pair of chucking mechanisms for chucking two of the work pieces 10, which have been arranged parallel, and conveys the work pieces 10 without changing their headings.

The resin molding section (D) includes: a molding die, which is constituted by an upper die 40 and a lower die 41 for clamping and molding the work piece 10; and a press unit 42 holding the molding die. The press unit 42 includes: a fixed platen 43 holding the upper die 40; a movable platen 44 holding the lower die 41; and a die clamping mechanism 46 for pressing and clamping the molding die. In the present embodiment, the press unit 42 further includes: an electric motor to drive the die clamping mechanism; and a press mechanism constituted by a toggle mechanism.

A release film feeding mechanism, which includes a feeding roll and a collecting roll, is provided to the upper die 40. The feeding roll feeds a release film 80 to a molding face of the upper die 40 so as to cover the molding face, and the collecting roll collects the used part of the release film therefrom. The feeding roll and the collecting roll are synchronously driven with the resin molding action.

The product measuring section (E) comprises: an X-Y table 60 for holding two molded products 50, which have been molded in the resin molding section (D); and a sensor unit 62 for measuring resin molded parts of the products 50. The X-Y table 60 arranges the products 50 as well as the planar arrangement of the products 50 on the molding die of the resin molding section (D).

A structure of the sensor unit 62 is the same as that of the sensor unit 22 of the work piece measuring section (B). Namely, two pairs of sensors correspond to two of the products 50 held by the X-Y table 60. Each pair of the sensors are vertically arranged with a prescribed separation. The X-Y table 60 is horizontally moved between the sensors of the sensor unit 62. A camera 63 for processing picture images is provided above the X-Y table 60 as well as the camera 21 provided above the X-Y table 20.

An unloader 64, which conveys the products 50 from the resin molding section (D) to the product measuring section (E), is provided on the rear side of the resin molding section (D). The unloader 64 picks up the products 50 from the lower die 41 and transfers them to the X-Y table 60 with maintaining their planar arrangement in the press unit 42 of the resin molding section (D).

The product accommodating section (F) is provided in a right front part of the base.

A pick-up mechanism 70, which picks up the products 50, is provided above a forward position of the X-Y table 60. The pick-up mechanism 70 picks up the products 50 from the X-Y table 60 and inserts them into a magazine (not shown). In FIG. 2, an elevator 74 accommodates magazines, in which products 50 are stored, into a magazine accommodating unit.

Work Piece Setting Mechanism

Figure 7:
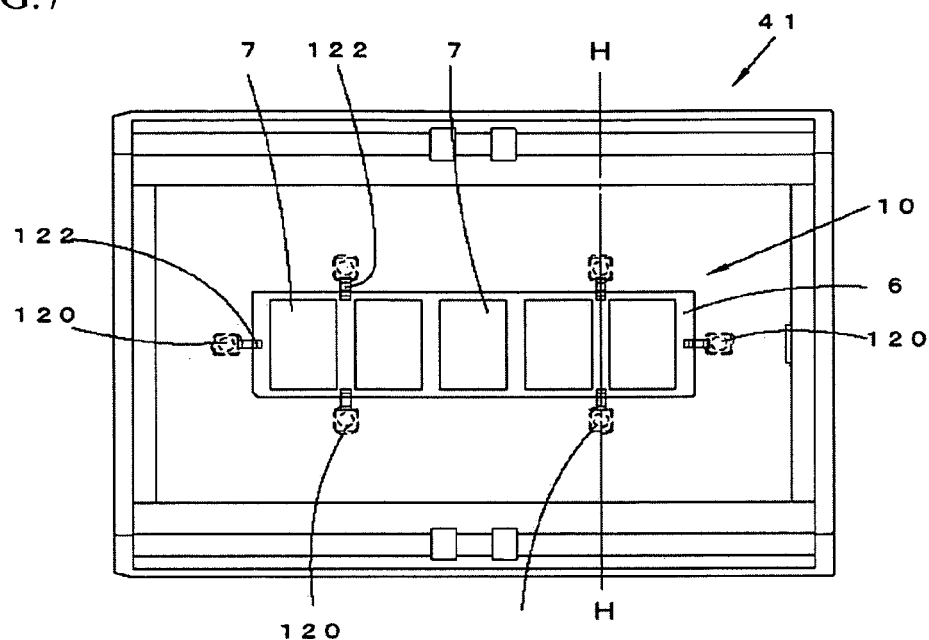
FIG. 7 is a plan view of a work piece setting mechanism of a molding die.
Figure 8:
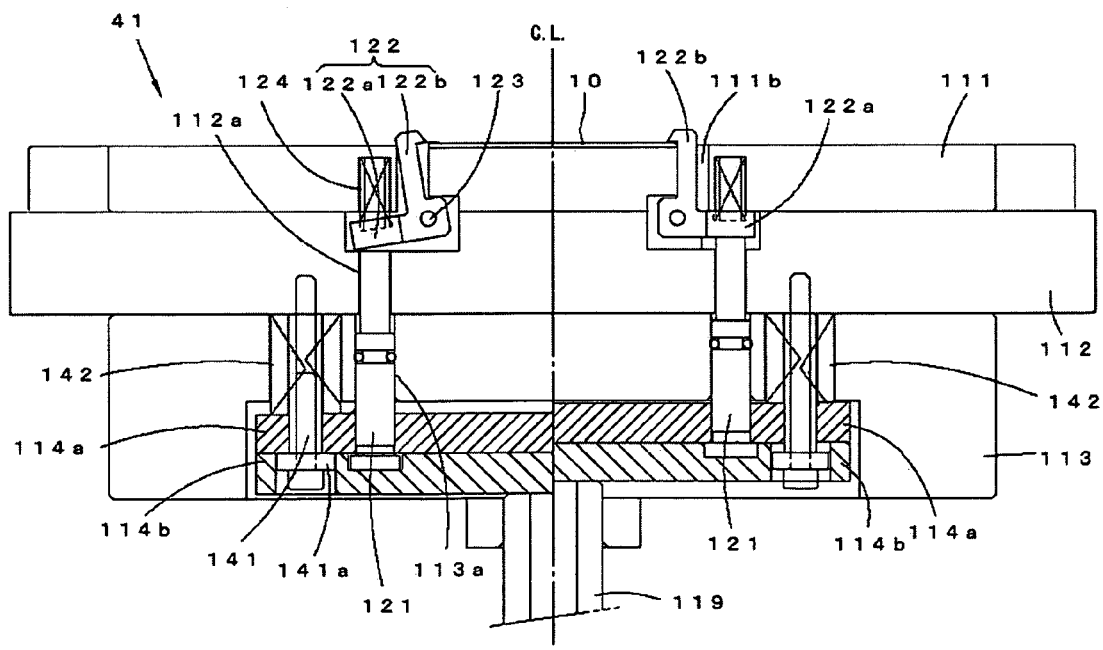
FIG. 8 is a sectional view of the work piece setting mechanism.

A mechanism for setting the work piece 10 in the molding die of the resin molding section (D) is shown in FIGS. 7 and 8.

FIG. 7 is a plan view of the lower die 41. Resin molding areas 7 correspond to the semiconductor chips of the work piece 10. Cavities for compression molding are formed in the upper die 40, and they correspond to the resin molding areas 7.

In FIG. 7, press mechanisms 120, which press edges of a substrate 6 onto a clamping face, are provided. One press mechanism 120 presses each short edge of the substrate 6; two press mechanism 120 press each long edge thereof.

The press mechanisms 120 have hooks 122, and the hooks 122 engage with the edges of the substrate 6 and press the substrate 6 onto the clamping face of the lower die 41. Holes are formed in the upper die so as to prevent the hooks 122 from interfering with a clamping face of the upper die 40.

FIG. 8 is a sectional view taken along a line H-H shown in FIG. 7. Movable plates 114a and 114b are attached in a base block 113 of a base of the lower die 41, and they are guided to move in an open-close direction of the molding die by pins 141. Front ends of the pins 141 are screwed with a holding block 112, shaft parts thereof are pierced through the movable plate 114 and heads 141a thereof contact a bottom face of the movable plate 114a. Springs 142, which respectively bias the movable plates 114a and 114b downward, are provided to the pins 141 as biasing means.

Each of the press mechanisms 120 includes: a movable pin 121, which is vertically extended from the movable plates 114a and 114b; and the hook 122, which is actuated by an upper end of the movable pin 121. A base end of the movable pin 121 is held by the movable plates 114a and 114b, and their upper ends are extended into the holding block 112.

The movable pins 121 are slidably pierced through holes 112a and 113a, which are formed in the holding block 112 and the base block 113, and movable in the open-close direction of the molding die.

Each of the hooks 122 is formed into an L-shape and constituted by a contact arm 122a, which is actuated by the upper end of the movable pin 121, and a hooking part 122b for hooking the work piece 10. A shaft 123, which allows the hook 122 to turn in a vertical plane, is provided to a bended part of the hook 122.

A claw of the hooking part 122b is projected from an upper edge of a hole 111b bored in a chase block 111.

A movable end of the contact arm 122a, which is actuated by the movable pin 121, is always biased toward the upper end of the movable pin 121 by a spring 124.

A driving rod 119 contacts a bottom face of the movable plate 114b, which is attached in the base block 113 together with the movable plate 114a. The driving rod 119 is driven by proper means, e.g., electric motor, hydraulic mechanism, so as to actuate the movable plates 114a and 114b in the open-close direction of the molding die.

On the left side of a center line CL of FIG. 8, the work piece 10 is set in the lower die 41. When the work piece 10 is set in the lower die 41, the movable plates 114a and 114b are biased downward by the springs 142 and located at lowermost position and the movable pins 121 are located at lowermost positions, so that the hooking parts 122b of the hooks 122 of the press mechanisms 120 are outwardly turned. In this state, the work piece 10 can be set without interfering with the hooking parts 122b.

After the work piece 10 is set in the lower die 41, the movable plates 114a and 114b are pushed by the driving rod 119. On the right side of a center line CL of FIG. 8, the movable plates 114a and 114b are moved upward by the driving rod 119. By moving the movable plates 114a and 114b upward by the driving rod 119, the movable pins 121 are moved upward and the upper ends of the movable pins 121 push and turn the contact arms 122a of the hooks 122, so that the hooking parts 122b are inwardly turned about the shafts 123. With this action, the claws of the hooking parts 122a engage with the edges of the work piece 10. By further turning the hooking parts 122a, the work piece 10 is pressed onto the clamping face of the lower die 41 and held there.

Since the press mechanisms 120 are arranged to enclose the work piece 10, all of the hooks 122 simultaneously press the work piece 10, so that the work piece 10 can be automatically positioned at a correct setting position. The lower die 41 is heated to solidify resin for molding the work piece 10. By employing the press mechanisms 120, the work piece 10 can be held at the setting position even if the work piece 10 is expanded by the heat.

Since the work piece 10 is pressed on the lower die 41 by the hooks 122, the entire work piece 10 can uniformly contact the lower die 41, so that deformation of the work piece 10 can be prevented. Further, the work piece 10 is efficiently heated by the lower die 41, so that the resin can be solidified for a short time.

In a conventional resin molding equipment, firstly the work piece 10 is set on the lower die 41, and the work piece 10 is heated and thermally stabilized, then the work piece 10 is clamped by the molding die. On the other hand, in the present embodiment, the work piece 10 is set on the lower die 41 and held by the hooks 122, then the work piece 10 can be immediately clamped by the dies 40 and 41. Therefore, a cycle time of the resin molding can be shortened.

Structure of Dispenser

Figure 9:
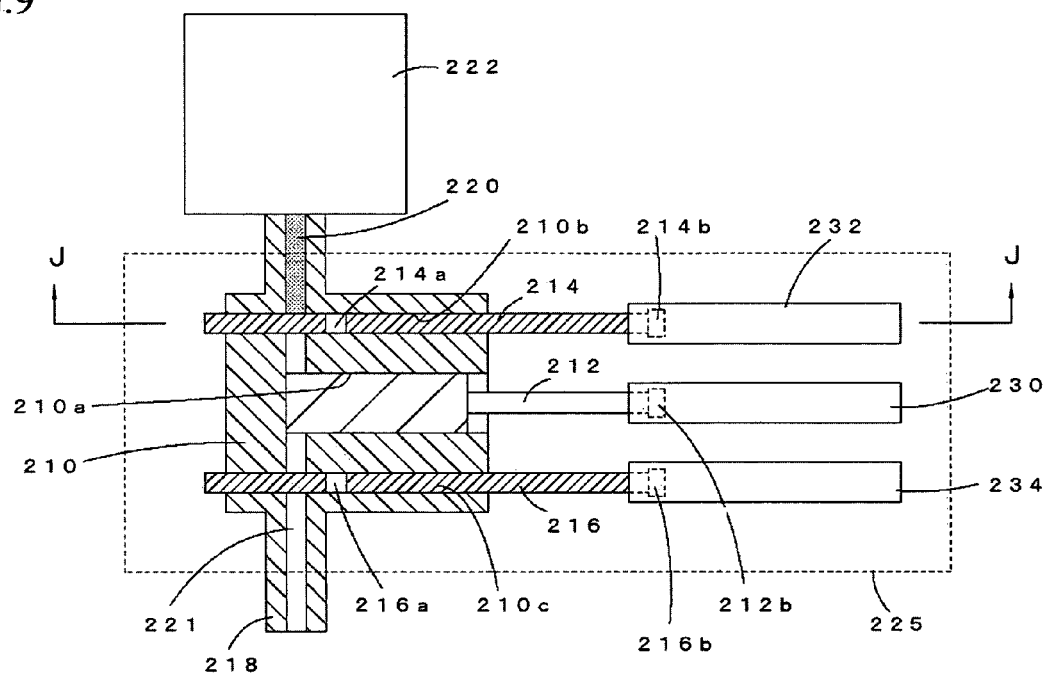
FIG. 9 is a sectional view of a dispenser.

FIG. 9 shows one dispenser 30a of the dispensers 30a and 30b. The other dispenser 30b has the same structure.

The dispenser 30a comprises: a cylinder block 210; a plunger 212 slidably provided in a cylinder 210a formed in the cylinder block 210; a supply valve 214 for controlling to supply the liquid resin; and a discharge valve for controlling to discharge the liquid resin. Through-holes 210b and 210c, in which the valves 214 and 216 are liquid-tightly inserted, are formed in the cylinder block 210, and they are parallel to the cylinder 210a. A flow path 220, which communicates a resin storing container 222 to the cylinder 210a, and a flow path 221, which communicates a discharge nozzle 218 to the cylinder 210a, are formed in the cylinder block 210.

The valves 214 and 216 are provided to respectively intersect with the flow paths 220 and 221. Communication holes 214a and 214b, which are respectively communicate to the flow paths 220 and 221, are respectively formed in the valves 214 and 216.

Base ends 212b, 214b and 216b of the plunger 212 and the valves 214 and 216 are respectively connected to driving units 230, 232 and 234. In the present embodiment, sectional shapes of the base ends 212b, 214b and 216b are formed into T-shapes as connectable projections; connecting ends, which are T-shaped slots and can be engaged with the T-shaped base ends 212b, 214b and 216b, are respectively formed in the driving units 230, 232 and 234. The base ends 212b, 214b and 216b cannot be disconnected from the connecting ends in their axial directions.

Figure 10:
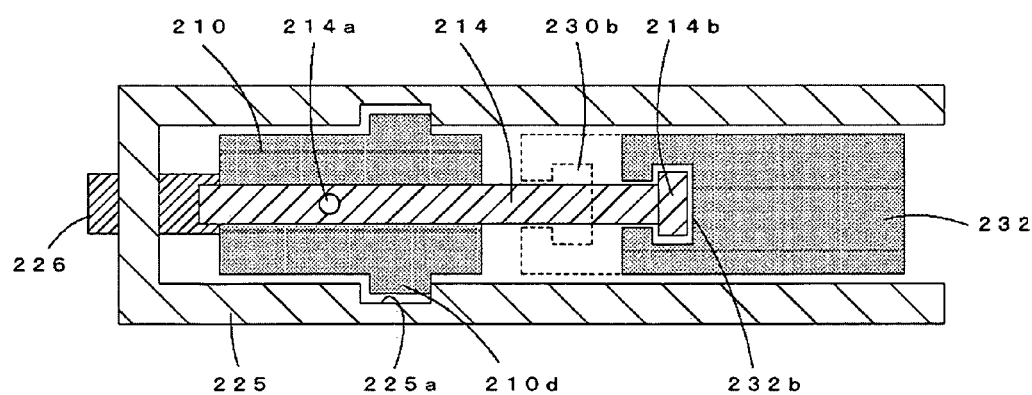
FIG. 10 is a sectional view taken along a line J-J shown in FIG. 9.

FIG. 10 is a sectional view taken along a line J-J shown in FIG. 9. Since the base end 214b of the supply valve 214 is the T-shaped slot 232b of the driving unit 232, the valve 214 is not disconnected from the slot 232b in a driving direction of the driving unit 232. Therefore, the valve 214 is reciprocally moved together with the driving unit 232. Note that, the driving unit 232 is proper means, which is connected to the valve 214 and capable of reciprocally moving the valve 214. For example, a servo motor mechanism, an air cylinder mechanism, etc. may be used. The driving units 230 and 234 have the same structures.

In FIG. 10, the cylinder block 210 is fixed to a frame 225, which is fixed to a base member of the resin molding equipment. A planar shape of the frame 225 is formed into a U-shape, and vertical grooves 225a are formed in inner faces of the frame 225. Bosses 210d, which are respectively engaged with the vertical grooves 225a, are formed on side faces of the cylinder block 10.

A screw 266 is provided to a front part of the frame 225. The screw 266 backwardly pushes the cylinder block 210, whose bosses 210d are engaged with the grooves 225a, so that rear faces of the bosses 210d are pressed onto inner faces of the grooves 225a. Therefore, the cylinder block 210 is fixed to the frame 225.

In the dispenser 30a of the present embodiment, when the supply valve 214 is moved to a communicating position, at which the communication hole 214a corresponds to the flow path 220, and the discharge valve 216 is move to a closing position, at which the communication hole 216a is shifted from the flow path 221, the plunger 212 is moved backward, then the liquid resin is sucked from the container 222 to the cylinder 210a. Next, the supply valve 214 is moved to a closing position and the discharge valve 216 is move to a communicating position, then the plunger 212 is moved forward, so that the liquid resin stored in the cylinder 210a is discharged from the nozzle 218. By repeating the above described actions, a prescribed amount of the liquid resin is sucked from the container 222 and discharged from the nozzle 218 for each time.

In the dispenser 30a of the present embodiment, the cylinder block 210 can be easily attached to and detached from the frame 225. To detach the cylinder block 210 from the frame 225, firstly the screw 226, which contacts the front end of the cylinder block 210, is slackened, then the cylinder block 210 is moved upward with respect to the frame 225 so that the cylinder block 210 can be separated from the frame 225. The connecting ends of the plunger 212, etc. can be detached from the driving unit 230, etc. in the vertical direction.

After detaching the cylinder block 210 from the frame 225, the plunger 212 and the valves 214 and 216 are pulled out from the cylinder block 210 so that an inner part of the cylinder block 210, the plunger 212, etc. can be cleaned.

To attach the cylinder block 210 to the frame 225, the connecting ends 212b, 214b and 216b of the plunger 212 and the valves 214 and 216 are corresponded to the T-shaped slots 230b, 232b and 234b, then the cylinder block 210 is fitted in the frame 225 from the upper side. With this action, the plunger 212 and the valves 214 and 216 can be connected to the driving units 230, 232 and 234.

Figure 11:
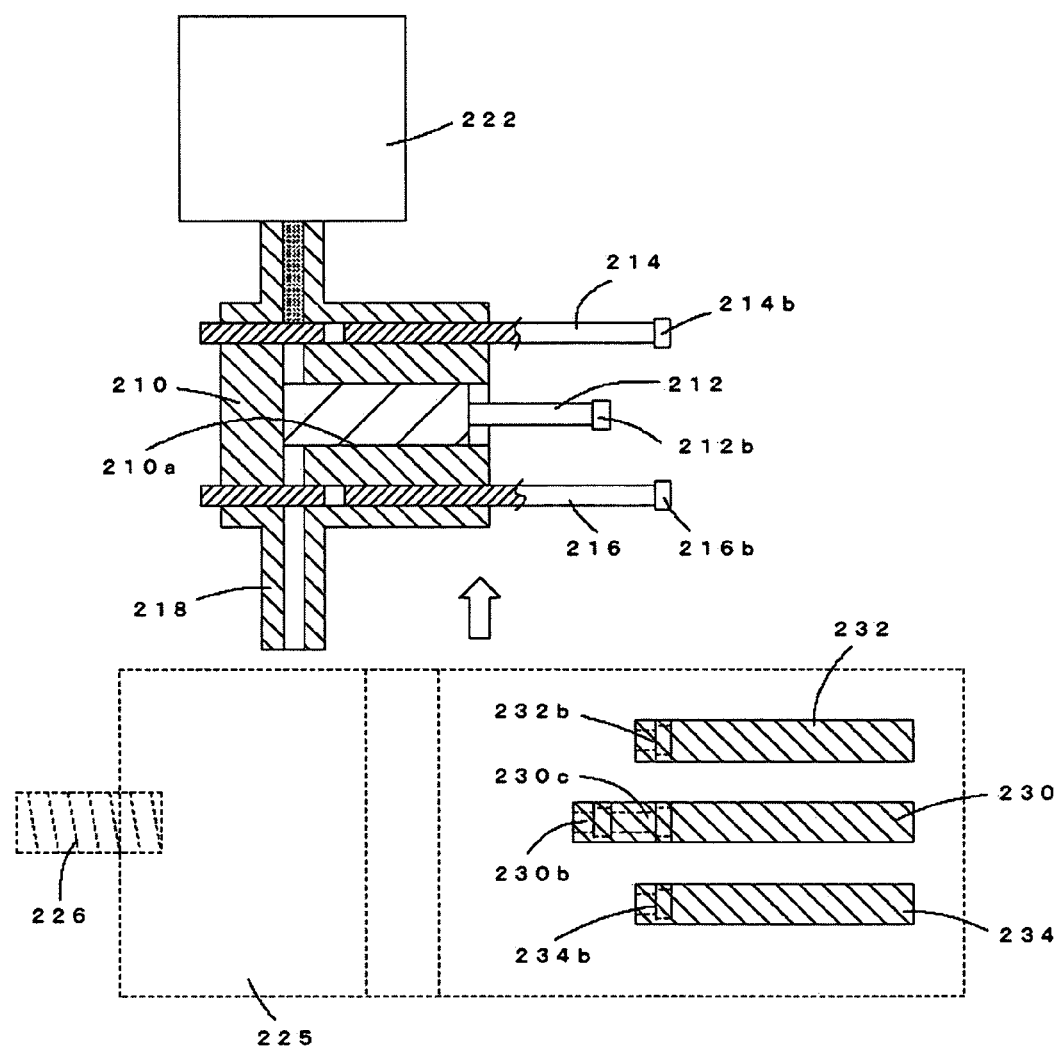
FIG. 11 is an explanation view showing another mechanism for connecting a frame to a cylinder block.

Note that, engaging positions, at which the plunger 212 and the valves 214 and 216 are engaged with the driving units 230, 232 and 234, in the vertical direction need not be the same. For example, in FIG. 11, the engaging position of the plunger 212 is shifted forward with respect to those of the valves 214 and 216. In this case too, heights and planar arrangements of the plunger 212 and the valves 214 and 216 are corresponded to those of the driving units 230, 232 and 234, so that the plunger 212, etc. can be attached to and detached from the driving units 230, etc. by moving the plunger 212, etc. in the vertical direction. A hole 230c is formed in the driving unit 230 so as to prevent the discharge valve 216 from interfering with the driving unit 230 while the attaching and the detaching action. In FIG. 10, the driving unit 230 arranged as shown in FIG. 11 is shown as dotted lines.

In any cases, the plunger 212 and the valves 214 and 216 are engaged with the driving units 230, 232 and 234, and they cannot be disconnected in the axial directions or reciprocating directions but can be disconnected in the directions perpendicular to the axial directions. The structures of the connecting parts are not limited to the T-shaped connecting ends and the T-shaped slots.

In the above described embodiment, the bosses 210d of the cylinder block 210 engage with the grooves 225a of the frame 225. On the other hand, bosses may be formed in the frame 225 and engaged with grooves formed in the cylinder block 210. Further, the cylinder block 210 may have flat side faces, and bosses, which contact a rear face of the cylinder block 210, may be formed in inner faces of the frame 225. Namely, any structures, which allow the cylinder block 210 to be attached to and detached from the frame 225 in the vertical direction but restrict the cylinder block 210 to move backward with respect to the frame 225, may be employed.

In the dispensers 30a and 30b of the present embodiment, the plunger 212, etc. can be easily connected to the driving unit 230, etc. without using screws, and the plunger 212, etc. can be pulled out from the frame 225 together with the cylinder block 210. Therefore, when slidabilities of the plunger 212, etc. become worse, the dispensers 30a and 30b can be easily detached from the resin molding equipment and done maintenance. With this structure, conditions of the resin molding equipment, in which the work pieces are molded with liquid resin, can be always sufficiently maintained.

Note that, in the resin molding equipment of the present embodiment, the work piece 10 is held by the X-Y table 34, and the dispensers 30a and 30b, whose positions are fixed, supply liquid resin to the work piece 10. In other embodiments, the dispensers 30a and 30b or their nozzles may be movable and supply liquid resin to a prescribed part of the work piece 10, which has been fixed at a predetermined position.

Resin Molding Action

Successively, the resin molding action of the resin molding equipment shown in FIGS. 1 and 2 will be explained.

The magazines accommodated in the setting unit 11 are lifted, step by step, by the elevator 12, and the work pieces 10 are fed to the turn table 14, one by one, by the take-out mechanism. The turn table 14 receives the first work piece 10, which has been fed by the take-out mechanism, at one holding position, then the turn table 14 is turned 180 degrees and receives the second work piece 10 at the other holding position. With this action, two of the work pieces 10 are arranged parallel.

The work pieces 10, which have been arranged parallel on the turn table 14, are moved to the setting position, which is located rear side of the turn table 14, via the feeder rails 16a and 16b.

From there, two of the work pieces 10 are transferred to the X-Y table 20 of the work piece measuring section (B) by the inloader 36. To transfer the work pieces 10 onto the X-Y table 20, the inloader 36, which has picked up the work pieces 10, is moved sideward along the feeder rails 16a and 16b, then the work pieces 10 are transferred onto the X-Y table 20.

After transferring the work pieces 10 to the X-Y table 20, picture images of the work pieces 10 are loaded by the camera 21 and processed so as to detect faulty points of the work pieces, e.g., no semiconductor chips, deficits.

In the work piece measuring section (B), firstly the X-Y table 20 is moved in the longitudinal direction of the work pieces 10 so as to measure thicknesses of the semiconductor chips 10b of a first line, then the X-Y table 20 is moved in the horizontal direction so as to measure thicknesses of the semiconductor chips 10b of a second line.

Figure 6:
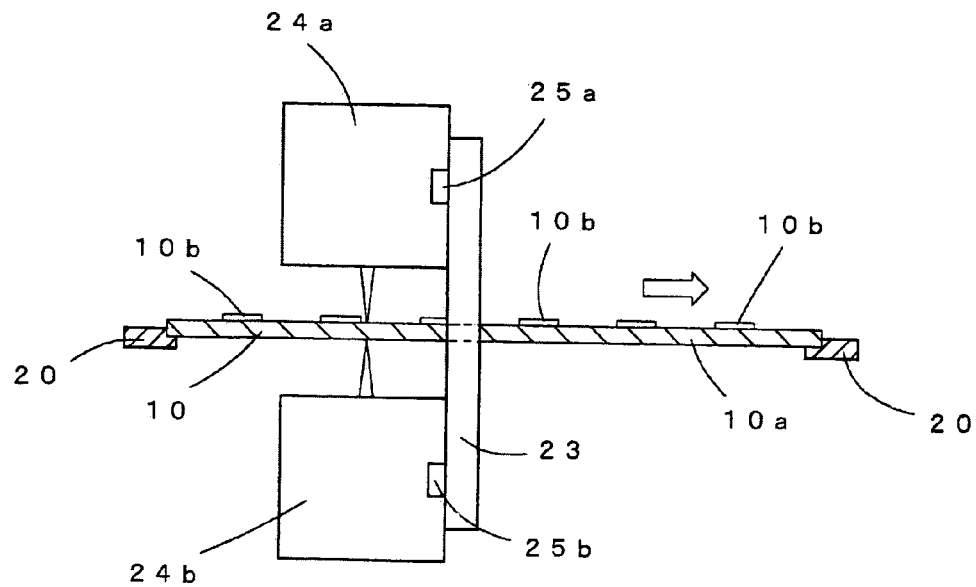
FIG. 6 is an explanation view, in which the sensor unit measures work pieces.

In FIG. 6, thicknesses of the semiconductor chips 10b of the work pieces 10 are measured with moving the X-Y table 20.

Since the sensors 24a and 24b are located above and under the work pieces 10, thickness of each semiconductor chip 10, which is calculated by subtracting thickness of the substrate 10a, can be correctly measured even if the substrate 10a is bent or deformed. Further, mounting no semiconductor chip can be detected on the basis of the data measured by the sensors 24a and 24b.

The data of the semiconductor chips 10b, which are measured by the measuring section (B), are used or feed-backed for controlling amount of the resin supplied by the resin supplying section (C). Namely, the control section (G) calculates amount of supplying the resin for each semiconductor chip 10b on the basis of the measured thickness of the semiconductor chip 10b. Further, the control section (G) controls the resin supplying section (C) so as to supply the calculated amount of resin to each semiconductor chip 10b. If no semiconductor chip is detected at prescribed position of the substrate 10a, a required amount of resin at the position is calculated, and the resin supplying section (C) supplies the required resin thereto.

After measuring the thicknesses of the work pieces 10, the inloader 36 transfers the work pieces 10 from the X-Y table 20 to the X-Y table 34 of the resin supplying section (C). In the resin supplying section (C), liquid resin is supplied to two of the work pieces 10, which are held by the X-Y table 34, by the dispensers 30a and 30b.

The X-Y table 34 is intermittently moved in the longitudinal direction of the work pieces 10, as well as the X-Y table 20 of the measuring section (B), so as to continuously supply the liquid resin to the semiconductor chips 10b of the work pieces 10, which are held by the X-Y table 34. Firstly, the liquid resin is supplied to the semiconductor chips 10b of the first line, then supplied to the semiconductor chips 10b of the second line. Note that, the manner of supplying the liquid resin is not limited to the above described manner. For example, the liquid resin may be simultaneously supplied to all lines of the semiconductor chips.

The resin molding action in the resin molding section (D) will be explained. Firstly, the movable platen 44 of the press unit 42 is moved downward to open the molding die, then the work pieces 10 are set on the lower die 41 by the inloader 36. Next, the lower die 41 is moved upward to clamp the work pieces 10 between the dies 40 and 41. In this state, the work pieces 10 can be molded. In the present embodiment, the work pieces 10 are clamped between the dies 40 and 41 together with the liquid resin, which have been supplied to the work pieces 10, so that the work pieces 10 can be molded with the resin. This method is called "Compression molding".

By clamping the work pieces 10 between the dies 40 and 41 together with the liquid resin for a prescribed time, the resin solidifies and the molded products are produced.

When the resin completely solidifies, the lower die 41 is moved downward so as to open the molding die, then the molded products 50 are taken out from the molding die by the unloader 64. The unloader 64 transfers two of the products 50 from the molding die to the X-Y table 60 of the product measuring section (E).

In the product measuring section (E), thicknesses of resin molded parts of the products 50 are measured by laser sensors, which are provided above and under the products 50, as well as the manner of measuring the thicknesses of the semiconductor chips 10b by the work piece measuring section (B). The thicknesses of the resin molded parts of all products 50 are measured with moving the X-Y table 60. Further, picture images of the products 50 are loaded by the camera 63 and processed so as to detect faulty points of the products, e.g., insufficient molding, deficits.

The data measured by the measuring section (E), e.g., thicknesses of the resin molded parts, data of the picture images, are feed-backed for controlling amount of the resin supplied by the resin supplying section (C). Namely, the control section (G) calculates amount of supplying the resin for each semiconductor chip 10b on the basis of the measured thickness of the semiconductor chip 10b. Further, the control section (G) controls the resin supplying section (C) so as to supply the suitable amount of resin to the work pieces 10. Therefore, the thicknesses of the resin molded parts of the products 50 can be limited in an allowable range.

However, in some cases, the thicknesses of the resin molded parts of the products 50 deviate from the allowable range due to characteristics of the work pieces 10, a structure of the molding die, characteristics of the press unit 42, etc. Thus, the thicknesses of the resin molded parts of the products 50 can be limited in the allowable range by feed-backing the data measured by the product measuring section (E). Namely, the resin supplying section (C) is capable of adjusting the amount of supplying the resin.

For example, in case of molding new products, the amount of the resin, which is supplied by the resin supplying section (C), can be efficiently and correctly determined by the steps of: measuring thicknesses of the semiconductor chips 10b of the work pieces 10; setting the amount of supplying the resin, which is supplied by the resin supplying section (C); and adjusting the amount of supplying the resin, which is supplied by the resin supplying section (C), on the basis of the measure data of the molded products. Namely, molding conditions of the resin molding equipment can be easily determined.

In case of changing characteristics of the work pieces 10 and the liquid resin, variations of the resin molded parts of the molded products 50 can be supplemented by adjusting the amount of supplying resin, which is supplied by the resin supplying section (C), on the basis of the measured data of the products 50. Namely, by continuously measuring the molded products 50 and monitoring variations of the resin molded parts of the products 50, the amount of supplying resin, which is supplied by the resin supplying section (C), can be previously adjusted on the basis of their tendencies.

The amount of supplying the resin can be controlled to limit variations of shapes of the resin molded parts of the products 50, which are caused by changing molding conditions, within an allowable range by feed-backing tendencies of the measured data, which are measured by the product measuring section (E), to the amount of supplying the resin, which is supplied by the resin supplying section (C). Even if shapes of the resin molded parts deviate from the allowable range, mass production of inferior products can be prevented by feed-backing the measured data to the resin supplying section (C).

By feed-backing the measured data of the resin molded parts of the products 50 to the amount of the resin supplied by the resin supplying section (C), the resin molding can be precisely performed with variations. In case of forming thin resin molded parts, whose thicknesses are, for example, 1 mm or less, it is very effective to always monitor thicknesses of the thin resin molded parts of the products and control the resin supplying section (C) on the basis of results of the monitor. With this action, the thin resin molded parts can be sufficiently formed.

In the above described embodiment, the semiconductor chips 10b are linearly arranged on the substrate 10a of the work piece 10, but the work piece to be molded by the resin molding equipment of the present invention is not limited to the work piece 10 of the embodiment. For example, the resin molding equipment of the present invention is capable of molding a plurality of semiconductor chips as one group, an entire side face of a semiconductor wafer, etc. In case of molding an entire side face of a semiconductor wafer, thickness of a molded product may be feed-backed to the resin supplying section (C) without measuring thickness of a work piece. If bosses and concaves are formed in surfaces of work pieces so that required amounts of resin are varied, the amount of supplying the resin may be controlled by measuring the surfaces of the work pieces.

Method of Resin Molding Stack-Type Product

Figure 12A:
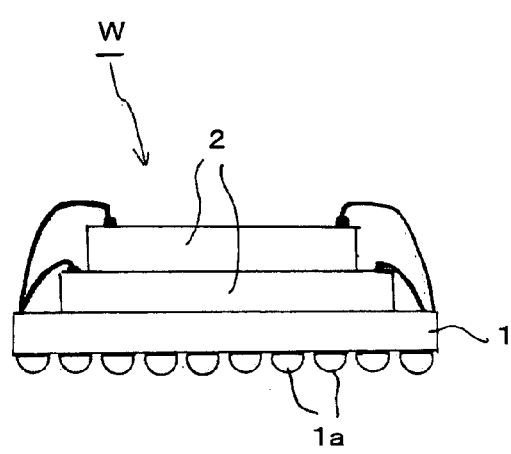
FIGS. 12A and 12B are explanation views of the work piece, on which semiconductor chips are stuck.
Figure 12B:
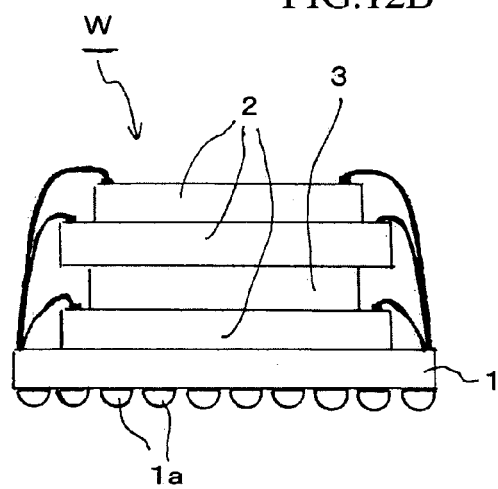

FIGS. 12A and 12B show work pieces, in each of which semiconductor chips 2 are stacked. In FIG. 12B, a spacer 3 is inserted between the semiconductor chips 2. The semiconductor chips 2 are stacked on one side face of substrates 1, and they are arranged like matrixes or maps.

In case of molding the work piece, in which semiconductor chips are stacked, the work piece can be suitably molded by adjusting an amount of supplying resin.

Figure 13A:
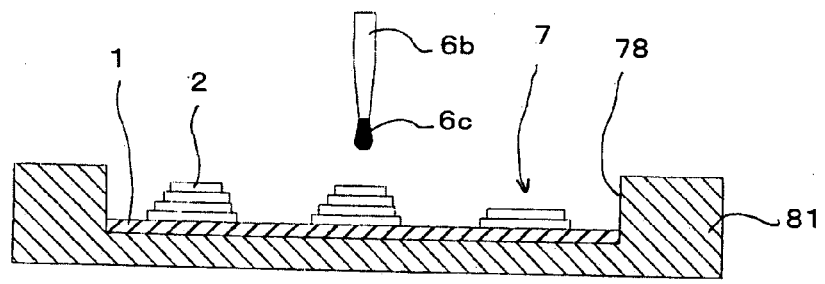
FIGS. 13A and 13B are explanation views of the work piece, to which liquid resin is supplied.
Figure 13B:
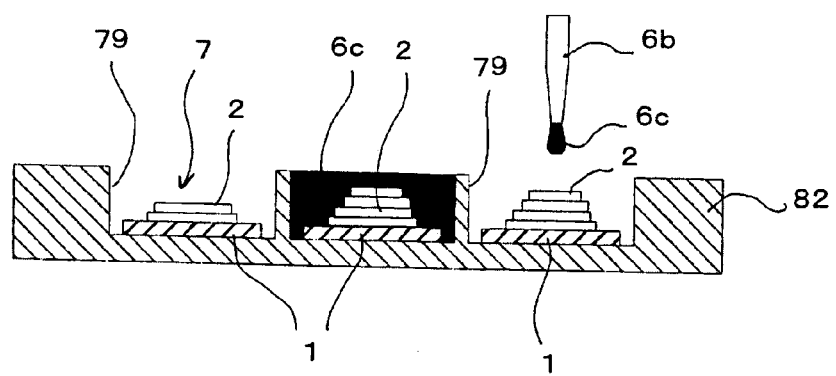

In FIGS. 13A and 13B, a dispenser nozzle 6b applies liquid resin 6c to a work piece, and the work piece, to which the liquid resin 6c has been applied, is clamped between an upper die and a lower die so as to compression-mold the work piece.

Figure 14:
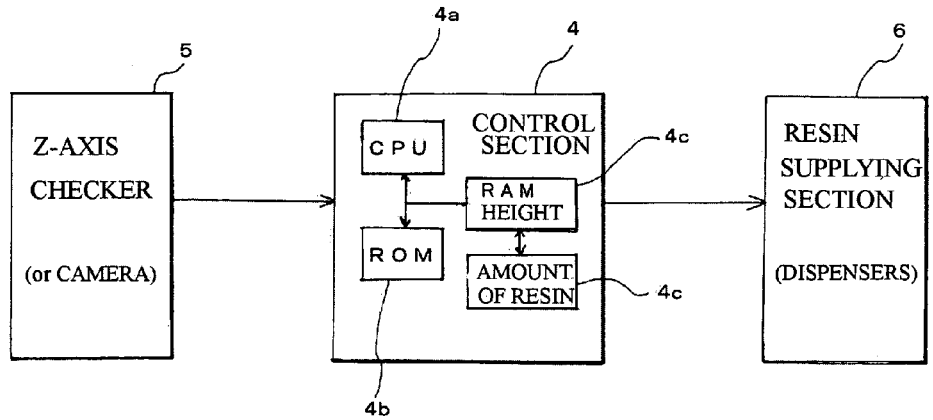
FIG. 14 is a block diagram of a control system of the resin molding equipment.

A control system, which controls the resin supplying section including the dispenser, will be explained with reference to FIG. 14. A control section 4 includes: a CPU 4a sending control commands to a resin supplying section 6 on the basis of data sent from a Z-axis checker 5; a ROM 4b storing operation programs of the dispenser nozzle 6b, etc.; and a RAM 4c for storing inputted data, acting as a work area of the CPU 4a, etc. Z-axis data (heights), capacity data and amounts of supplementing resin for each semiconductor chips are stored in the RAM 4c.

The Z-axis data or heights of the semiconductor chips 2 are sent from the Z-axis checker 5 to the control section 4. The control section 4 calculates a required amount of resin on the basis of the Z-axis data sent from the Z-axis checker 5 and sends the calculated data to the resin supplying section 6 as the control command.

Figure 15:
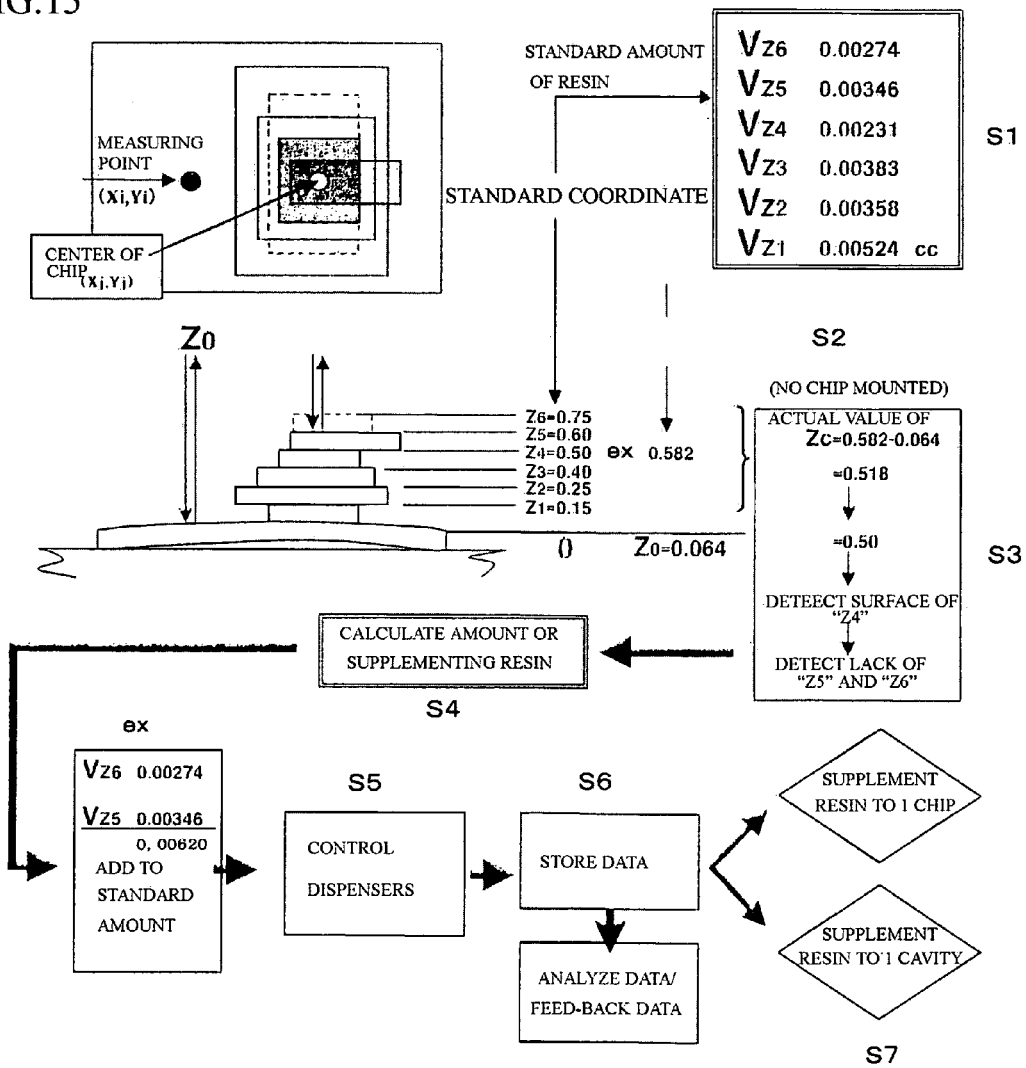
FIG. 15 is a flowchart of a resin supplying action.

A method of controlling an amount of supplying resin will be explained with reference to FIG. 15.

Firstly, a Z-axis height of each layer of the work piece is measured, as the Z-axis data, before compression molding. In this example, six layers of the semiconductor chips 2 are stacked in the work piece. A symbol Z0 is a standard plane (measuring point: Xi, Yi), which indicates a height from a substrate 1 or a height from a bottom face of the chip, e.g., Z0=0.064 mm). Note that, preferably the value Z0 is measured every time due to warpage of the substrate 1. The height data of the six layered semiconductor chips 2 are, for example, Z1=0.15 mm-Z6=0.75 mm. The required amounts of resin for molding the semiconductor chips 2, e.g., Vz1=0.00524 cc-Vz6=0.00274 cc, are previously stored in the control section 4. These data are calculated on the basis of a volume of each semiconductor chip 2 with respect to a cavity of a molding die (Step S1).

Next, the Z-axis height of the work piece is measured by the Z-axis checker 5. A height Zc from an upper face of the chip is measured at a center of the outermost semiconductor chip 2 (measuring point: Xj, Yj). Then, the standard height Zo near the chips is measured. The Z-axis checker 5 reads the height Zc by irradiating a laser beam to the semiconductor chip and measuring a focal distance of the reflected beam (Step S2). For example, if the value Zc is 0.582 mm, Zc−Zo=0.582−0.064=0.518 mm, and it is near the datum Z4=0.50 mm. Thus, the control section 4 judges that the datum Zc is a height from a surface of the semiconductor chip 2 of the fourth layer (Step S3). Therefore, the control section 4 further judges that the semiconductor chips of the fifth and sixth layers are missed or lacked, then the control section 4 adds Vz5+Vz6=0.00346+0.00274=0.00620 cc to the standard amount of supplying resin so as to determine an actual amount of supplying resin (Step S4).

The control section 4 sends data for controlling amounts of supplying resin to the work pieces, in each of which the semiconductor chips are arranged like matrixes or maps, to the resin supplying section 6 (Step S5). The resin supplying section 6 stores the data for one work piece (Step S6) and supplies the liquid resin to the substrate 1 for each chip or each cavity (Step S7). The data for each work piece, which have been stored, are used as control data for supplying the resin. Even if the work piece, which has the same missed or lacked layers, is supplied next time, the stored actual amount of resin supplied to the former work piece is feed-backed, so that an amount of supplementing resin can be analyzed. Therefore, the work piece can be sufficiently molded.

The above described steps are repeated to mold the work pieces. In the above description, as shown in FIG. 13A, the liquid resin 6c, whose volume supplements a lacked part 7 of the semiconductor 2, is supplied into a molding die 81, which has one cavity 78 for molding the work pieces as one group, and liquid pressure is maintained during the compression molding. On the other hand, as shown in FIG. 13B, if a molding die 82, in which work pieces are respectively molded in cavities 79, is used, the control section 4 controls the resin supplying section 6 so as not to supply the resin 6c into the cavity 79 accommodating the semiconductor chip 2 having the lacked part 7, so that wasteful consumption of the resin 6c can be prevented.

Note that, the lacked part 7 of the semiconductor chip 2 may be detected by processing image data instead of measuring the Z-axis heights with the Z-axis checker 5. For example, the Z-axis height of the semiconductor chip 2 may be measured on the basis of a focal distance of the uppermost semiconductor chip 2 or a shape of the semiconductor chip 2.

In case of molding the work piece in which a plurality of the semiconductor chips 2 are stacked, the amount of supplying resin is adjusted on the basis of the existence of lacked parts of the semiconductor chips. With this method, variations of heights of molded products can be prevented, further wasteful consumption of the resin can be prevented.

Resin Molding Method with Pressure Reduction

Figure 16:
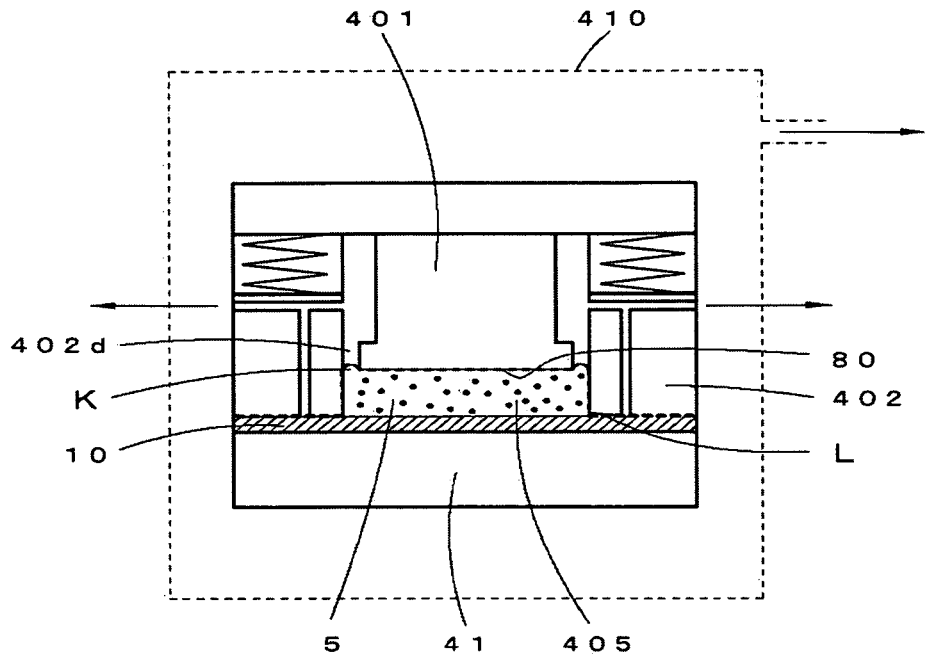
FIG. 16 is a sectional view, in which projections are formed when a work piece is compression-molded.

As shown in FIG. 16, one side face of the work piece 10 is molded by the compression molding method. In some cases, resin 5 invades into air sucking paths 402d, which are formed between a cavity block 401 and a clamper 402 so as to suck and fix a release film 80 onto an inner face of a cavity, so that projections "K" are formed in an outer face of a molded product. Further, the release film 80 is broken in the air sucking paths 402d, so that the resin 5 invades into a sliding part between the cavity block 401 and the clamper 402 and a molding die cannot be smoothly operated.

If the work piece 10 is molded with discharging air from a resin molding area by a vacuum chamber 410, the resin 5 easily leaks from the cavity to the vacuum chamber 410, so that a resin fin "L" is formed in the work piece 10 along a clamping face of the clamper 402 clamping the work piece 10.

Figure 17:
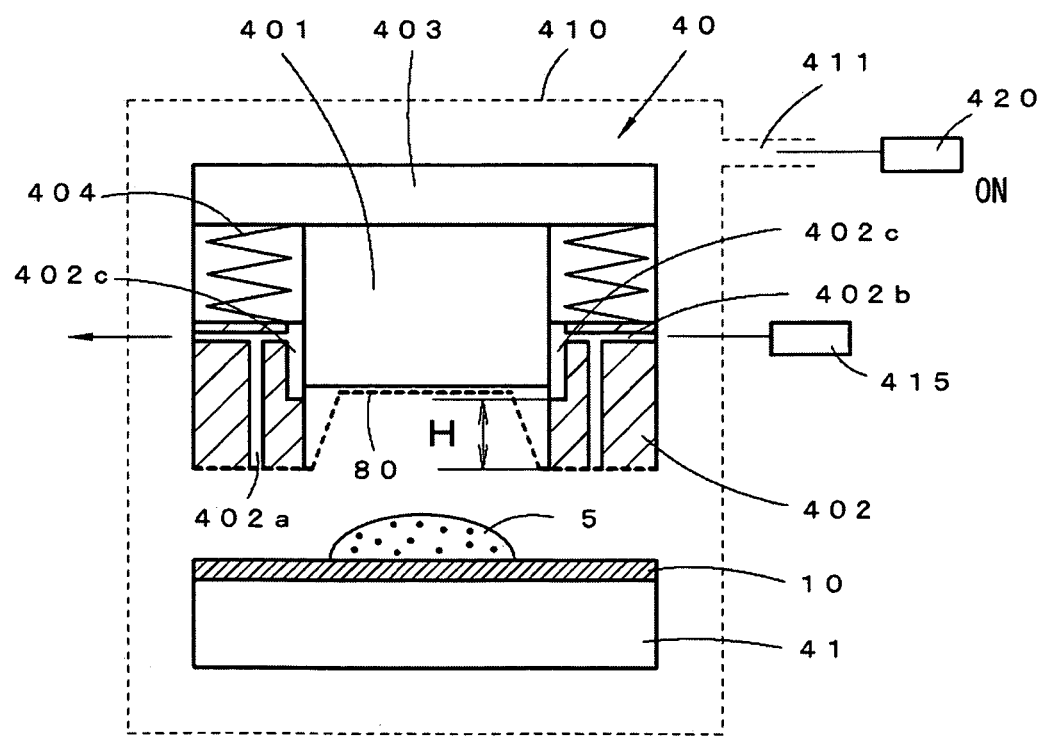
FIG. 17 is a sectional view of the opened molding die, in which a work piece is set.

To solve the above described problems, as shown in FIG. 17, air sucking holes 402c, which suck air so as to suck the release film 80 toward the inner face of the cavity, are formed in inner faces of the clamper 402, which slide on outer faces of the clamper 401. The air sucking paths 402c are communicated to an air path 402b. The air sucking paths 402c are formed on the inner faces of the clamper 402 like grooves. A plurality of the air sucking paths 402c are arranged to enclose the cavity block 401.

When the molding die is opened and the clamper 402 is located at the lowermost position, a distance "H" between a lower end of the air sucking path 402c and the clamping face is shorter than a distance between a bottom face of the cavity block 401 and the clamping face. Namely, the air sucking paths 402c are communicated to a cavity concave when the molding die is opened.

The cavity block 401 and the clamper 402, which is formed into a rectangular frame enclosing the cavity block 401, are provided to the upper die 40, the cavity block 401 is held by an upper die base 403, and the clamper 402 is biased downward by springs 404 so that the clamping face of the clamper 402 is projected toward the lower die 41 from the bottom face of the cavity block 401.

The resin molding area, in which the work piece 10 is clamped and molded, is enclosed by the vacuum chamber 410, and the vacuum chamber 410 is communicated to a vacuum unit 420 via an air discharge path 411.

Air sucking paths 402a for sucking and fixing the release film 80 onto the clamping face of the clamper 402, are opened in the clamping face, and they are communicated to air paths 402b formed in the clamper 402. The air paths 402b are communicated to an air sucking mechanism 415, which is separately provided from the vacuum unit 420 for discharging air from the vacuum chamber 410. In the present embodiment, the air sucking holes 402a and the air sucking holes 402c are communicated to the common air paths 402b. In other cases, the air sucking holes 402a and the air sucking holes 402c may be communicated to different air sucking mechanisms, and sucking the release film 80 via the air sucking holes 402a and sucking the release film 80 via the air sucking holes 402c may be independently controlled.

In FIG. 17, the molding die is opened, the work piece 10 is set on the lower die 41, and the release film 80 is sucked and fixed on the clamping face of the clamper 402 and inner faces of the cavity concave. After setting the work piece 10 on the lower die 41, the resin molding area is encased by the vacuum chamber 410, then the vacuum unit 420 discharge air form the vacuum chamber 410 via the air discharge path 411.

The air sucking mechanism 415 sucks and fixes the release film 80 onto the inner faces of the cavity concave with high vacuum degree, which is greater than vacuum degree of the vacuum chamber 410. The ends of the air sucking holes 402c are opened near the inner ceiling face of the cavity concave or the bottom face of the cavity block 401, so that the release film 80 can be securely sucked toward the inner ceiling face of the cavity concave and can be easily sucked along the inner faces of the cavity concave.

Figure 18:
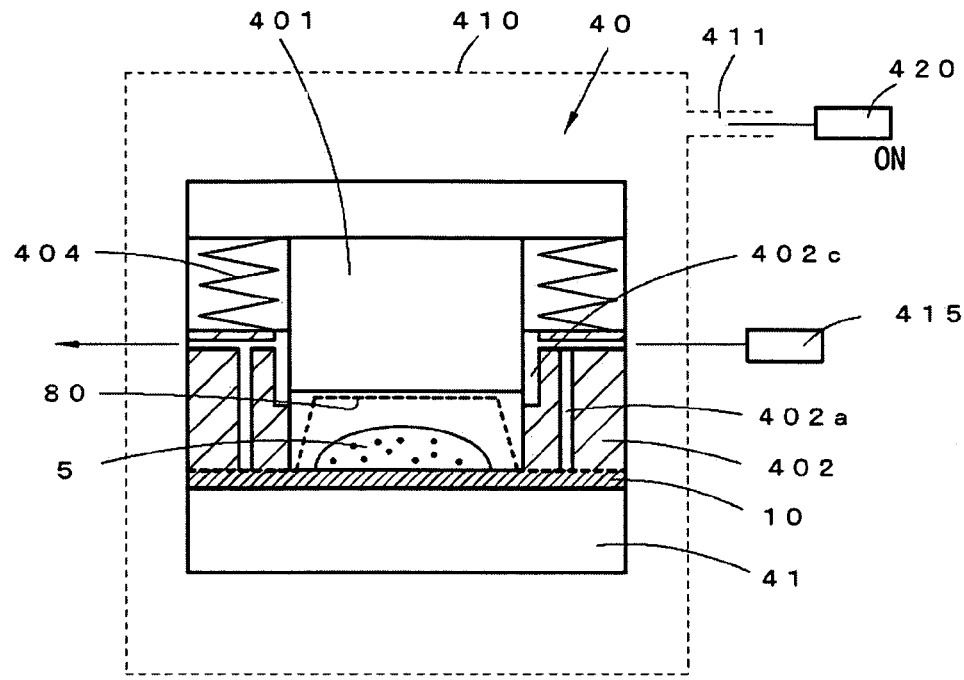
FIG. 18 is a sectional view of the molding die clamping the work piece.

In FIG. 18, the work piece 10 is clamped between the upper die 40 and the lower die 41, and a cavity 405 is formed on the upper side of the work piece 10. When the clamper 402 contacts the work piece 10, the air sucking holes 402c of the clamper 402 are opened in the cavity 405, and the release film 80 is sucked toward the inner ceiling face of the cavity concave by sucking air with the air sucking mechanism 415.

Figure 19:
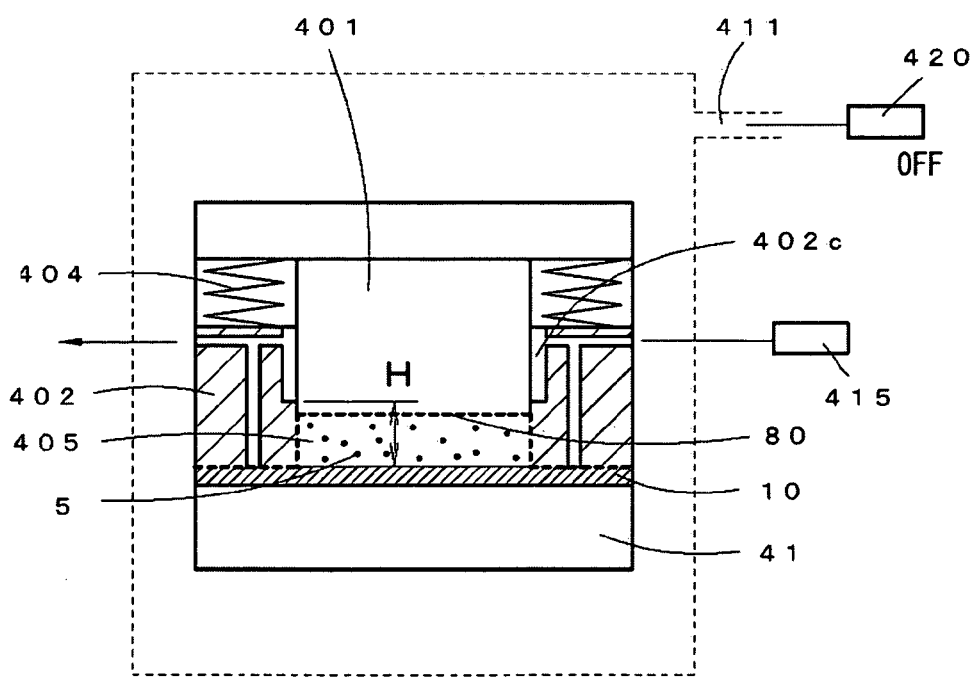
FIG. 19 is a sectional view of the molding die compression-molding the work piece.

Next, the movable die is moved until reaching a clamping position, then the work piece 10 is compression-molded (see FIG. 19). The cavity 405 is filled with the resin 5, and the resin 5 is pressurized and hot-cured.

In the state of compression-molding the work piece 10 in the cavity with the resin 5, the distance between the bottom face of the cavity block 401 and the clamping face is shorter than the distance "H" between the lower ends of the air sucking holes 402c and the clamping face. Namely, when the work piece 10 is completely molded with the resin 5, a depth of the cavity 405 is shorter than the distance "H", so that the communication between the cavity concave and the air sucking holes 402c are closed. The flat side faces of the clamper 402 and the bottom face of the cavity block 401 constitute the inner faced of the cavity 405. Therefore, forming resin fins, which are projected in the air sucking holes 402c, can be prevented.

In the above described method, the resin molding area is encased by the vacuum chamber 410 and air is discharged therefrom during the mold, so that air can be purged from the cavity 405 and no voids can be formed in the molded product.

In the present embodiment, the distance "H" is shorter than the distance between the bottom face of the cavity block 401 and the clamping face when the molding die is opened, but the distances may be substantially equal. If the air sucking holes 402c are formed in the inner faces of the clamper 402, sucking-resistance in air paths for sucking the release film 80 are lowered; even if the distances are equal, air can be sucked via clearance parts so that the release film 80 can be fixed on the inner faces of the cavity 405.

Resin Molding Method with Dummy Cavity

Figure 20:
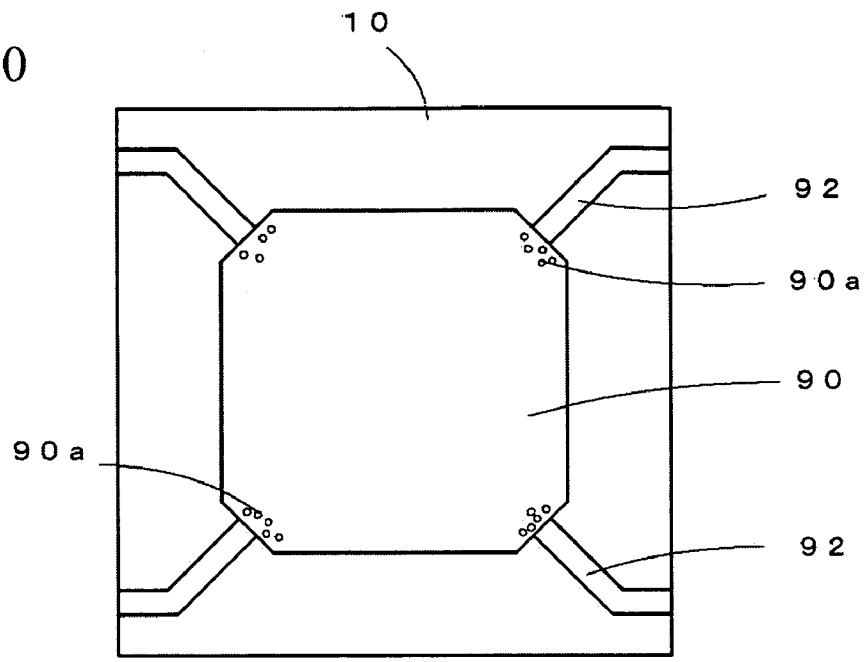
FIG. 20 is a plan view of a molded work piece having air vents.

When a work piece is clamped and compression-molded by a molding die, air vents may be formed in a surface of a substrate of the work piece. In FIG. 20, the work piece 10 is compression-molded with resin, and thin resin fins 92 are formed in the air vents, which are respectively connected to corners of a resin molded parts 90.

The air vents prohibit the resin from discharging from a cavity. In the present embodiment, the air vents, whose depth are about 0.03 mm, are formed by grinding a clamping face of a molding die. With this structure, flow resistance of the air vents are great as air discharging means, so air cannot be securely discharged and air voids may be formed in the resin molded part 90. Since the air vents are formed in the surface of the substrate of the work piece 10, air is easily trapped in the vicinity of outer faces of the resin molded part 90 and the corners thereof. Namely, voids 90a are easily formed in the vicinity of the corners of the resin molded part 90.

Figure 21:
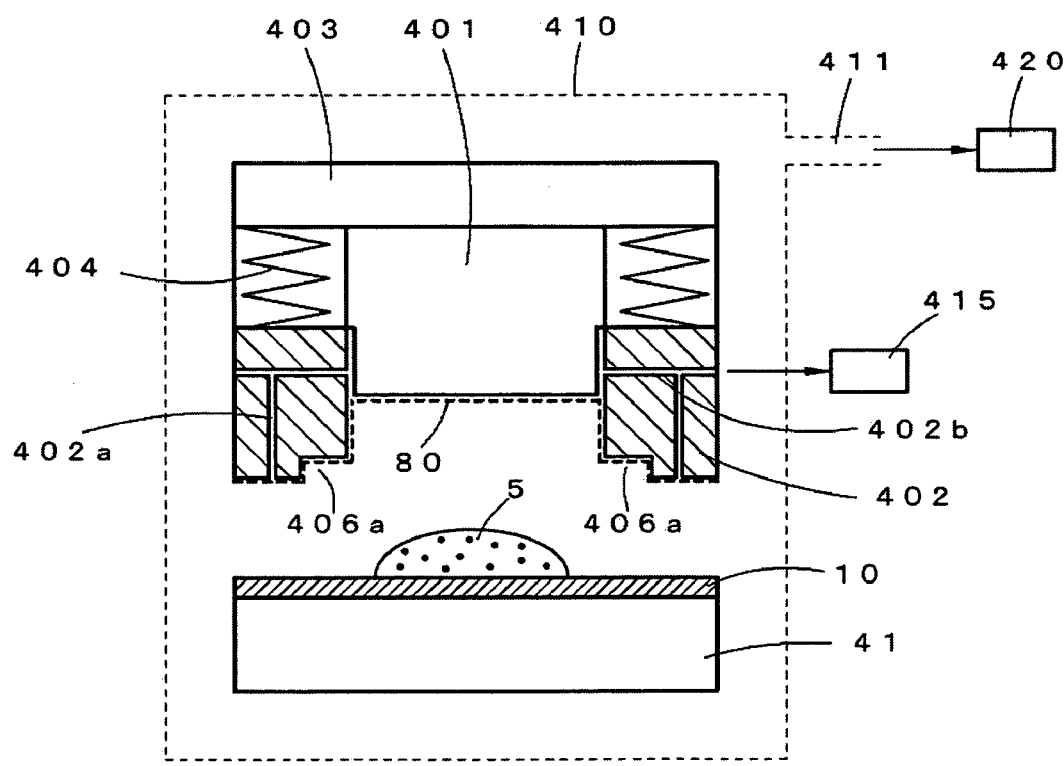
FIG. 21 is a sectional view of a molding die having dummy cavity concaves.
Figure 22:
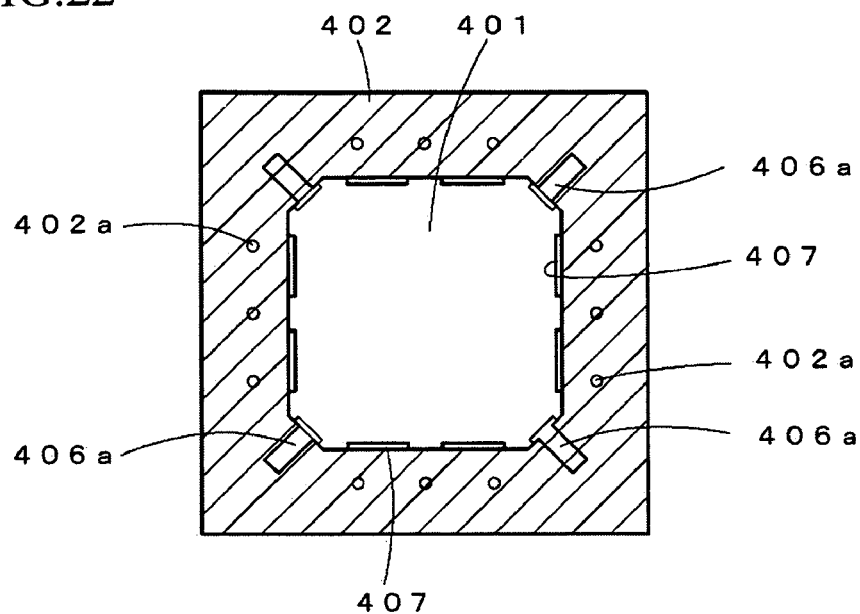
FIG. 22 is a plan view of a cavity block and a clamper.

To solve the problem, it is effective to mold the work piece 10 with a molding die shown in FIGS. 21 and 22. The molding die is characterized by forming dummy cavity concaves 406a in the clamping face of the clamper 402 of the upper die 40.

FIG. 22 shows the cavity block 401 and the clamper 402 seen from the lower side. The dummy cavity concaves 406a are formed in the clamper 402. Inner ends of the dummy cavity concaves 406a correspond to corners of the cavity block 401. Note that, the corners of the cavity block 401 are planed, and the inner ends of the dummy cavity concaves 406a correspond to the planed parts.

The air sucking holes 402a for sucking the release film 80 are formed in the clamping face of the clamper 402. The air sucking holes 402a are communicated to the air paths 402b formed in the clamper 402, and the air paths 402b are communicated to the air sucking mechanism 415. Grooves are formed in outer faces of the cavity block 401. Since the cavity block 401 is slidably fitted in the clamper 402, holes 407 are formed therebetween. The holes 407 are communicated to the air paths 402b of the clamper 402.

In FIG. 21, the molding die is opened, the work piece 10 is set on the lower die 41, and the resin 5 is supplied to the work piece 10. The release film 80 is sucked on the clamping face of the clamper 402, and the release film 80 is fixed on the inner faces of the cavity by sucking air via the air paths 402b. The air sucking holes 402a and air sucking paths, which opened in the cavity, need not be communicated to the common air paths 402b. In other cases, they may be communicated to different air sucking mechanisms.

The release film 80 is easily peeled off from the solidified resin 5, and it has enough heat resistance to heat of the molding die and enough flexibility and elasticity so as to easily sucked and held along the inner faces of the cavity concave.

The resin molding area is encased and air-tightly closed by the vacuum chamber 410, and the vacuum unit 420 discharges air from the vacuum chamber 410 via the air discharge path 411.

Figure 23:
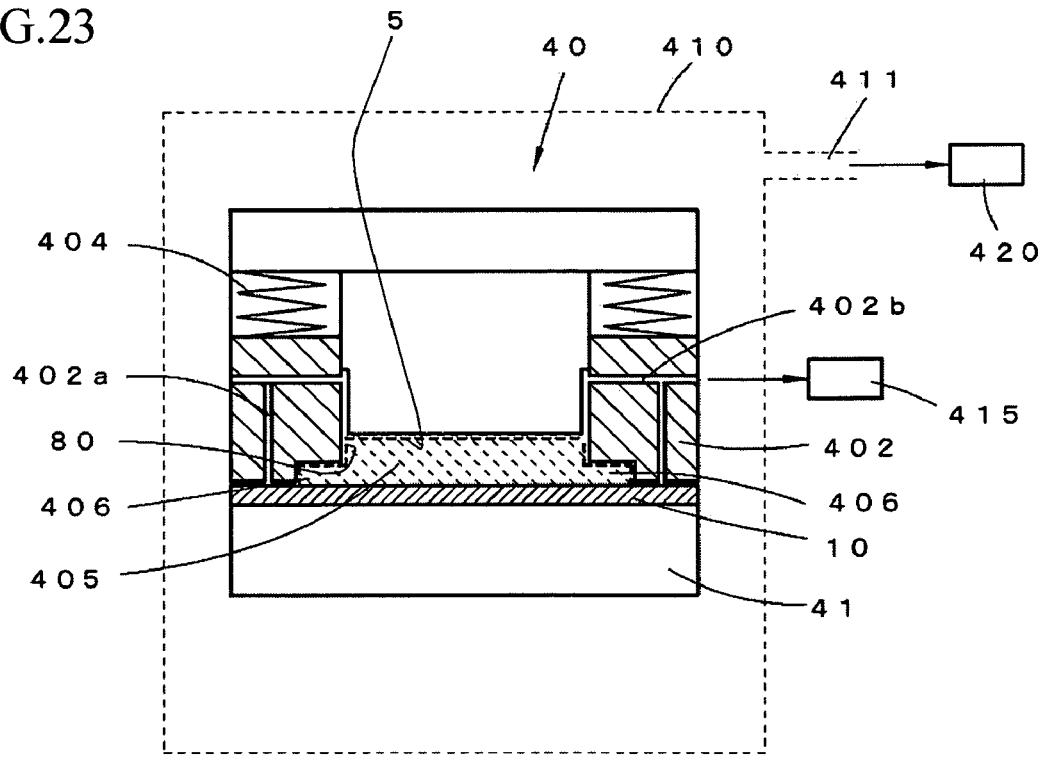
FIG. 23 is a sectional view of the molding die having the dummy cavity concaves, in which a work piece is compression-molded.

In FIG. 23, the work piece 10 is clamped and compression-molded between the upper die 40 and the lower die 41. The cavity 405 and the dummy cavities 406a are filled with the resin 5, and the resin 5 is pressurized and hot-cured.

In the present embodiment, the resin 5 is introduced into the cavity 405 and the dummy cavities 406a with gradually moving the movable die until reaching the clamping position. Since the cavity 405 and the dummy cavities 406a are filled with the resin 5 under reduced pressure, forming voids, which are formed in the resin 5 by residual air, can be effectively prevented.

To actively purge residual air from the dummy cavities 406a, air vents may be communicated to the dummy cavities 406a.

Positions of the dummy cavities are not limited to the corners of the cavity, For example, the dummy cavities may be formed at mid part of each edge of the cavity. Number of the dummy cavities, which communicate to the cavity, may be optionally selected. They may be provided to selected corners of the cavity.

In the above described embodiment, the resin molding is performed under reduced pressure, but the resin molding method, in which air is trapped by the dummy cavity, is not limited to the resin molding performed under reduced pressure.

The invention may be embodied in other specific forms without departing from the spirit of essential characteristics thereof. The present embodiments are therefore to be considered in all respects as illustrative and not restrictive, the scope of the invention being indicated by the appended claims rather than by the foregoing description and all changes which come within the meaning and range of equivalency of the claims are therefore intended to be embraced therein.

What is claimed is:

1. A resin molding equipment, comprising:
   a work piece feeding section;
   a work piece measuring section measuring thickness of a semiconductor chip mounted on a work piece;
   a resin supplying section supplying liquid resin to the work piece;
   a resin molding section having a molding die for molding the work piece with the liquid resin;
   a product measuring section measuring thickness of a resin molded part of the molded product;
   a product accommodating section; and a control section for controlling said sections,
   wherein said work piece measuring section includes an X-Y table for moving the work piece to a sensing position;
   said product measuring section includes an X-Y table for moving the molded product to the sensing position; and
   said control section includes means for adjusting an amount of the liquid resin, which is supplied to the work piece by said resin supplying section, on the basis of the thickness measured by said work piece measuring section and the thickness measured by said product measuring section.

2. The resin molding equipment according to claim 1, wherein the work piece has a substrate and a plurality of semiconductor chips mounted on the substrate, said product measuring section includes a sensor unit for measuring thickness of the resin molded parts of the semiconductor chips, and the adjusting means adjusts an amount of the liquid resin, which is supplied to the work piece by said resin supplying section, on the basis of the thickness of the resin molded parts measured by the sensor unit.

3. The resin molding equipment according to claim 2, wherein the sensor unit includes at least a pair of sensors, one of which irradiates a laser beam and the other of which receive a reflected laser beam so as to measure the thickness, are arranged in a thickness direction of the molded product and respectively provided on the both sides thereof.

4. The resin molding equipment according to claim 1, wherein the molding die includes:
   a press mechanism, which flatly presses the work piece onto a clamping face of the molding die when the work piece is set at a prescribed position in the molding die; and
   a driving rod for driving the press mechanism.

5. The resin molding equipment according to claim 4, wherein the press mechanism has a press hook, which is capable of pressing an edge of the work piece onto the clamping face and flatly holding the work piece thereon when the work piece is fed to the molding die, the press hook is capable of turning in a plane perpendicular to the clamping face, and the press mechanism further has a moving mechanism for moving the press hook between a pressing position, at which the press hook presses and holds the work piece on the clamping face, and a free position, at which the press hook does not interfere with the edge of the work piece.

6. The resin molding equipment according to claim 1, wherein said resin supplying section includes a dispenser, which supplies a prescribed amount of the liquid resin to the work piece, and
   the dispenser comprises:
   a cylinder block including a cylinder part storing the liquid resin, a fluid path connecting the cylinder part to a liquid container and a fluid path connecting the cylinder part to a discharge nozzle;
   a plunger sliding in the cylinder part;
   a supply valve being provided to the cylinder block, the supply valve opening and closing the fluid path between the cylinder block and the liquid container;
   a discharge valve being provided to the cylinder block, the discharge valve opening and closing the fluid path between the cylinder block and the discharge nozzle; and
   driving units respectively driving the plunger, the supply valve and the discharge valve
   wherein base ends of the plunger, the supply valve and the discharge valve are respectively connected to connecting ends of the driving units; and
   the connected parts are not disconnected in moving directions of the plunger, the supply valve and the discharge valve, but can be disconnected in directions perpendicular to the moving directions thereof.

7. The dispenser according to claim 6, further comprising: a frame for holding the cylinder block, the frame being engaged with the cylinder block, whereby the frame is allowed to disconnect from the cylinder block in the vertical direction, but the frame is inhibited to move rearward; and means for fixing the cylinder block to the frame, the fixing means being provided to a front part of the frame and pressing the cylinder block backward.

8. The resin molding equipment according to claim 1,
   wherein the molding die comprises:
   a cavity block being formed on the basis of an arrangement of a cavity, in which the work piece is molded with the resin;
   a clamper enclosing the cavity block so as to form a cavity concave, whose inner bottom face is constituted by an end face of the cavity block, the clamper being capable of sliding on a side face of the cavity block in directions of opening and closing the molding die; and
   an air sucking hole being formed in an inner face of the clamper, which slidably contacts the side face of the cavity block, the air sucking hole being communicated to the cavity concave so as to suck a release film into the cavity concave, the air sucking hole is formed at a prescribed position, where the sucking hole is communicated to the cavity concave when the die is opened and where the air sucking hole is closed when the cavity block is moved to a position for clamping the die.

9. The resin molding equipment according to claim 8, wherein a resin molding area of the molding die is located in a vacuum chamber, and the vacuum chamber is communicated to a vacuum unit.

10. The resin molding equipment according to claim 1, wherein the molding die has: a cavity for molding an element mounting area of an electronic device with the resin; and a dummy cavity being communicated to an edge of the cavity so as to trap air.

11. The resin molding equipment according to claim 10, wherein the molding die further has an air vent communicated to the dummy cavity.

12. The resin molding equipment according to claim 10, wherein a resin molding area of the molding die, which clamps and molds the work piece, is enclosed by a vacuum chamber, and air in the vacuum chamber is discharged by a vacuum unit.

13. A resin molding method performed in the resin molding equipment of claim 1, wherein a work piece, in which a plurality of semiconductor chips are layered on a substrate, is compression-molded in a molding die with resin, said method comprising the steps of: storing cubic volumes of the semiconductor chips and amount of supplying the resin to each semiconductor chip; measuring a distance "Z" between the substrate and the outermost semiconductor chip; detecting a number of layering the semiconductor chips on the basis of the measured distance "Z"; calculating amount of supplementing the resin to the semiconductor chips; sending the amount of supplementing the resin to the resin supplying section as control data; and supplying the resin to the work piece from the resin supplying section on the basis of the control data.

14. The method according to claim 13, wherein the amount of supplementing the resin corresponds to the cubic volume of the semiconductor chip which needs supplementation of the resin.

15. The method according to claim 13, wherein the distance "Z" is measured by a measuring instrument.

16. The method according to claim 13, wherein the distance "Z" is measured from an image photographed by an imaging device.

* * * * *